United States Patent
Krongauz et al.

(10) Patent No.: US 7,109,253 B1
(45) Date of Patent: *Sep. 19, 2006

(54) DIELECTRIC, RADIATION-CURABLE COATING COMPOSITIONS

(75) Inventors: Vadim V. Krongauz, Barlett, IL (US);
Stephen C. Lapin, Waterford, WI (US);
Anthony J. Tortorello, Elmhurst, IL (US)

(73) Assignee: DSM N.V., Heerlen (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1478 days.

(21) Appl. No.: 08/961,084

(22) Filed: Oct. 30, 1997

Related U.S. Application Data
(60) Provisional application No. 60/029,780, filed on Oct. 31, 1996.

(51) Int. Cl.
*C08F 2/50* (2006.01)
*C09D 163/10* (2006.01)
*C09D 175/16* (2006.01)

(52) U.S. Cl. ............... 522/92; 522/96; 522/98; 522/171; 522/173

(58) Field of Classification Search ............ 522/96, 522/90, 98, 173, 174, 175, 92, 171
See application file for complete search history.

(56) References Cited

U.S. PATENT DOCUMENTS

| 4,031,066 A | * | 6/1977 | Mori et al. ........ 260/77.5 CR |
| 4,481,258 A | | 11/1984 | Sattler et al. |
| 4,572,610 A | * | 2/1986 | Krajewski ............ 522/96 |
| 4,786,586 A | * | 11/1988 | Lee et al. ............. 522/96 |
| 4,826,705 A | * | 5/1989 | Drain et al. ........... 522/96 |
| 5,013,631 A | * | 5/1991 | Su ..................... 430/271 |
| 5,352,712 A | * | 10/1994 | Shustack ............... 522/98 |
| 5,980,995 A | | 11/1999 | Linsenbardt et al. |

FOREIGN PATENT DOCUMENTS

| EP | 0 801 041 A2 | 10/1997 |
| FR | 2328752 A | 5/1977 |
| JP | 07057551 A | 3/1995 |
| WO | 91/03498 | 3/1991 |

* cited by examiner

*Primary Examiner*—Susan W. Berman
(74) *Attorney, Agent, or Firm*—Pillsbury Winthrop LLP (57) ABSTRACT

A metal conductor is provided with a cured coating of about 2.5 μm to about 500 μm thickness, which cured coating has a dielectric dissipation factor (60 Hz, 24° C.) of lower than about 0.05 and is a radiation-cured coating formulated from components comprising: a) an acrylate functional urethane oligomer having a hydrocarbon backbone; b) one or more mono- or polyfunctional diluents; and optionally, c) one or more light sensitive radical generating compounds. The invention further provides a radiation-curable coating composition for coating a metal conductor. Also disclosed is a method of making a metal conductor provided with a cured coating of about 2.5 μm to about 500 μm thickness, which cured coating has a dielectric dissipation factor (60 Hz, 24° C.) of lower than about 0.05.

19 Claims, 6 Drawing Sheets

DIELECTRIC, RADIATION-CURABLE COATING COMPOSITIONS

This application claim benefit to provisional 60/029,780 filed Oct. 31, 1996.

FIELD OF THE INVENTION

This invention relates to radiation-curable coating compositions for coating metal conductors, and in particular, to coating compositions which provide good insulating properties in extreme conditions.

DESCRIPTION OF RELATED ART

Metal conductors are in general coated with a dielectric coating for insulating the conductor. Such coatings require good insulating properties in a variety of environments. It is particularly important for such coatings to provide good insulating properties under extreme conditions such as in transformer coils found in power distribution transformers. U.S. Pat. No. 4,481,258 issued to Sattler et al. discloses the use of paper as insulating material. Although Sattler proposes a coating be used as insulating material, it fails to disclose a coating sufficient to meet the requirements of an insulator in extreme conditions. As a result, paper insulation materials are still being used in the manufacture of transformer coils. The coatings proposed in Sattler are certain UV-curable materials comprising acrylate-ester adducts, acrylate urethane adducts and acrylate functional diluents. These coatings require both UV cure, and an additional post-cure at a temperature of 130° C. for 4–17 hr. The use in transformer coils of the coatings and processes disclosed in Sattler is unattractive; in particular because of the post-cure required.

Effective insulating coatings for high power transformer coils should exhibit the desirable properties described below.

As the metal is coated and thereafter is bent in a required form, the cured coating should be flexible so that it can withstand bending of the coated conductor as it is wound into a coil.

The cured coating should be able to withstand immersion in oil for 28 days at 150° C. as described in U.S. Pat. No. 4,481,258.

The cured coating should remain adherent at elevated temperature that is encountered when the transformer is under load.

The cured coating should have a dielectric constant smaller than 5% at 60 Hz (24° C.).

The cured coating should have a dielectric dissipation factor smaller than 0.05 at 24° C. before and after hot oil exposure and smaller than 0.2 at 150° C., both at 60 Hz.

It is an object of the present invention to provide dielectric radiation-curable coating compositions for metal conductors which have the properties identified above.

It is further an object of the present invention to disclose a method of manufacture of a radiation-curable coating composition having the properties identified above.

SUMMARY OF THE INVENTION

The Invention relates to a radiation-curable coating composition, which can be applied to a metal conductor at a thickness of about 2.5 μm to about 500 μm and preferably about 10 μm to about 50 μm. The coating composition, after cure, has a dielectric dissipation factor (60 Hz, 24° C.) of lower than about 0.05, the radiation-cured coating composition being formulated from components comprising:

a) an acrylate functional urethane oligomer having a hydrocarbon backbone b) one or more mono- or polyfunctional diluents, and optionally, c) one or more light sensitive radical generating compounds.

Furthermore, the invention relates to a radiation-curable coating composition for coating a metal conductor comprising:

a) an acrylate functional urethane oligomer having a hydrocarbon backbone b) one or more mono- or polyfunctional diluents; and optionally c) one or more light sensitive radical generating compounds, which coating, when cured with radiation, has a dielectric dissipation factor at 60 Hz at 24° C. of lower than about 0.05, a dissipation factor at 60 Hz at 150° C. of lower than about 0.2, and an elongation at 25° C. of a 25 μm thin coating of greater than about 50%.

The invention also relates to a method of making a radiation-curable coating composition, which can be applied to a metal conductor at a thickness of about 2.5 μm to about 500 μm and preferably about 10 μm to about 50 μm thickness which cured coating has a dielectric dissipation factor (60 Hz, 24° C.) of lower than about 0.05, the radiation-cured coating composition being formulated from components comprising:

a) an acrylate functional urethane oligomer having a hydrocarbon backbone b) one or more mono- or polyfunctional diluents, and optionally, c) one or more light sensitive radical generating compounds.

DETAILED DESCRIPTION OF THE INVENTION

The cured coating layer on the metal conductor has outstanding insulating properties, both at low and high temperature. The insulating cured coating layer has a low dielectric constant, e.g. lower than about 5 (60 Hz, 24° C.) and a good dielectric breakdown value. Furthermore, the cured coating is flexible as to allow bending of the metal conductor.

Metal substrates which can be coated with the radiation-curable coating composition are iron, copper, aluminum or silver conductor. In particular aluminum, copper or silver are preferred. The metal conductor can be in the form of a wire or a strip. The wire or strip can be shaped as necessary to meet the requirements of the application, such as for example, in a shape having a rectangular, square, oval or round cross-section. The coated metal conductor can be used in capacitors, transformers, motors and the like. The coated metal conductor can be used in hot oil environments because of the outstanding properties of the cured coating. Hence, the invention is most suitable for coating aluminum or copper strip or wire used in forming power distribution transformer coils. The cross-section of the strips commonly ranges from about 0.1–1.7 mm thick and 7–60 cm wide. The strips are wound into coils which are then assembled with cores to form transformers.

The radiation-curable coating composition is applied to the metallic substrate and subsequently cured to provide a protective, insulating coating. In general, a metal wire or strip is coated as a straight continuous web and the coated metal wire or strip may be wound for storage or for direct use. Hence, the coating when cured, should be cured well at the surface so that no blocking occurs in case the metal conductor is stored. Further, the cured coating of the present invention is flexible so that winding for either storage, and/or bending of the coil or wire in the manufacture of articles like transformers does not cause damage to the cured coating. Thus, the cured coating measured at 25 μm thickness, preferably has an elongation of at least about 50%. In particular, the coating has at least one Tg of below 20° C. (as measured by the peak of the tan δ curve in a Dynamic Mechanical Analysis (DMA) at 1 Hz.

As the coated metal conductor can be used in a hot oil environment, most preferably the cured coating has a dissipation factor at 60 Hz at 150° C. of lower than about 0.2. Furthermore, the cured coating preferably has an electrical dissipation factor at 60 Hz at 24° C. before and after a hot oil aging test of lower than about 0.05.

The cured coating of the present invention exhibits its insulating properties even when formed as a very thin film. The cured coating has a thickness of about 2.5 μm to about 50 μm, preferably between about 10 μm to about 100 and more preferably between about 10 μm to about 50 μm.

The first component of the radiation-curable coating is a hydrocarbon oligomer end-capped with acrylate functional urethane or acrylated acrylic groups. A preferred first component is an acrylate functional urethane oligomer (a) having a hydrocarbon backbone. The word backbone is used to denote the oligomer or polymer to which the acrylate urethane groups are attached. This acrylate functional urethane oligomer preferably is used in an amount of about 20–80 wt. % with respect to the total coating composition. More preferably, the amount is about 30–65 wt. %.

The oligomer (a) utilized in the present invention preferably is the reaction product of (i) a hydrocarbon compound with groups reactive with an isocyanate; (ii) a polyisocyanate; and (iii) an hydroxy functional endcapping monomer.

The hydrocarbon compound with groups reactive with an isocyanate (i) is provided by a linear or branched hydrocarbon containing a plurality of said reactive end groups, and providing a hydrocarbon backbone to the oligomer. The isocyanate reactive groups may be thiol, amine or hydroxy. Particularly preferred are hydroxy groups. Because of the amine and thiol groups, the urethane oligomer may comprise low concentrations of urea or thio-urea groups, for example below about 5 wt. %. The hydrocarbon portion is from about 200 to about 5,000 molecular weight and preferably from about 400 to about 4,000 molecular weight. Molecular weight in this case is determined by gel permeation chromatography (GPC), using a methylene chloride solvent, as measured against polystyrene molecular weight standards. The term "hydrocarbon" is defined as a non-aromatic compound containing a majority of methylene groups (—$CH_2$—) and which may contain internal unsaturation and/or pendent unsaturation. Fully saturated (i.e., hydrogenated) hydrocarbons are preferred because the electric dissipation factor of the cured coating increases as the degree of unsaturation increases. Suitable hydrocarbon polyols include hydroxyl-terminated, fully or partially hydrogenated 1,2-polybutandiene; 1,4- and 1,2-polybutadiene copolymers; 1,2-polybutadiene polyol hydrogenated to an iodine number of from 9 to 21; fully or partially hydrogenated polyisobutylene polyol; mixtures thereof, and the like. Preferably, the hydrocarbon polyol is substantially fully hydrogenated, and thus a preferred polyol is hydrogenated 1,2-polybutadiene, and hydrogenated 1,4-, 1,2-polybutadiene copolymers with about 50 wt. % to about 80 wt. % 1,4-butadiene and about 20 wt. % to about 50 wt. % 1,2-butadiene copolymerized monomers. Suitable hydrocarbon polyamines or polythiols include the above described polyols with thiol or amino groups instead of the hydroxy groups.

The polyisocyanate component (ii) is aromatic or non-aromatic, and preferably is non-aromatic. A suitable aromatic polyisocyanate is toluene diisocyanate. Non-aromatic polyisocyanates of from 4 to 20 carbon atoms may be employed. Suitable saturated aliphatic polyisocyanates include isophorone diisocyanate; dicyclohexylmethane-4,4'-diisocyanate; 1,4-tetramethylene diisocyanate; 1,5-pentamethylene diisocyanate; 1,7-heptamethylene diisocyanate; 1,8-octamethylene diisocyanate; 1,9-nonamethylene diisocyanate; 1,10-decamethylene diisocyanate; 2,2,4-trimethyl-1,5-pentamethylene diisocyanate; 2,2'-dimethyl-1,5-pentamethylene diisocyanate; 3-methoxy-1,6-hexamethylene diisocyanate; 3-butoxy-1,6-hexametalyene diisocyanate; omega,omega'-dipropylether diisocyanate; 1,4-cyclohexyl diisocyanate; 1,3-cyclohexyl diisocyanate; trimethylhexamethylene diisocyanate; and mixtures thereof. Isophorone diisocyanate is the preferred aliphatic polyisocyanate.

The reaction rate between a hydroxyl-terminated hydrocarbon and the diisocyanate may be increased by use of a catalyst in the amount of about 100 ppm to about 200 ppm. Suitable catalyst include dibutyl tin dilaurate, dibutyl tin oxide, dibutyl tin di-2-hexanoate, stannous oleate, stanous octoate, lead octoate, ferrous acetoacetate, and amines such as triethylamine, diethylmethlamine, triethylenediamine, dimethyl-ethylamine, morpholine, N-ethyl morpholine, piperazine, N,N-dimethyl benzylamine, N,N-dimethyl laurylamine, and mixtures thereof. A preferred catalyst is dibutyl tin dilaurate.

The endcapping monomer (iii) is a hydroxyl-terminated aliphatic acrylate or methacrylate, preferably an alkoxylated (meth)acrylate wherein 1–10 molecules of ethylene, propylene at butylene oxide are reacted with acrylic or methacrylic acid.

Suitable hydroxyl-terminated monoacrylates which may be used as the endcapping monomer include hydroxyethyl acrylate, hydroxyethyl methacrylate, hydroxypropyl acrylate and hydroxypropyl methacrylate. Hydroxyethyl acrylate is preferred because it imparts a faster cure rate to the polyurethane oligomer. The molar ratio of the hydrocarbon compound, diisocyanates and endcapping monomer is preferably approximately 1:2:2.

The second component (b) is constituted by one or more mono- or polyfunctional diluents. Preferably, the diluents are acrylate or methacrylate functional. However, minor amounts of other types of monomers can be used as well. The amount of component (b) preferably is about 20 wt. % to about 80 wt. % of the total coating composition, more preferred about 20 wt. % to about 70 wt. %. Particularly preferred is the use of about 10 wt. % to about 50 wt. % of monofunctional diluent(s), and about 5 wt. % to about 40 wt. % of polyfunctional diluent(s).

The second component (b) of the composition is a monomer which preferably comprises a monofunctional alkyl acrylate or methacrylate-based monomer. The alkyl portion of the monomer has between 6 and 18 carbon atoms, and preferably between 8 and 15 carbon atoms, and therefore is hydrocarbon in character. This monomer may be either straight chain, branched or cyclic. This component comprises from about 5 wt. % to about 50 wt. % of the composition, based upon the total weight of the coating composition. Preferably, it comprises from about 5 wt. % to about 50 wt. %, and more preferably from about 10 wt. % to about 40 wt. % of the composition.

The monomer, component (b) is selected to be one that is compatible with the oligomer discussed above. Suitable examples of $C_6$ to $C_{18}$ alkyl acrylate or methacrylate-based monomers include hexyl acrylate; hexyl methacrylate; cyclohexylacrylate; cyclohexyl-methacrylate; 2-ethylhexyl acrylate; 2-ethylhexyl methacrylate; isooctyl acrylate; isooctyl methacrylate; octyl acrylate; octyl methacrylate; decyl acrylate; decyl methacrylate; isodecyl acrylate; isodecyl methacrylate; isobornylacrylate; isobornylmethacrylate; lauryl acrylate; lauryl methacrylate; stearyl acrylate; stearyl methacrylate.

The second component, component (b), further comprises preferably an alkylacrylate polyfunctional diluent (or monomer) in an amount of about 5 wt. % to about 50 wt. %, preferably about 5 wt. % to about 40 wt. %. Suitable examples of these polyfunctional monomers are $C_4$–$C_{15}$ hydrocarbon diol acrylates; $C_4$–$C_{15}$ hydrocarbon diol methacrylates; and mixtures of the above. The term hydrocarbon includes cycloalkylgroups. Other suitable polyfunctional acrylates are (alkoxylated) polyolpolyacrylates. Examples of suitable polyfunctional monomers include butanediol dimethyacrylate, butanediol diacrylate, propanediol dimethacrylate, propanediol diacrylate, pentanediol dimethacrylate, pentanediol diacrylate, hexanediol dimethacrylate, hexanediol diacrylate, neopentylglycol dimethacrylate, neopentylglycol diacrylate, trimethylolpropane triacrylate, trimethylolpropane trimethacrylate, polypropylene glycol diacrylate, polypropylene glycol dimethacrylate, cyclohexanedimethanoldiacrylate or -methacrylate and, tricyclodecane dimethanol di(meth) acrylate.

Preferred alkyl acrylate monomers include isobornyl acrylate, 2-ethylhexylacrylate, isooctylacrylate, cyclohexylacrylate, hexanedioldiacrylate, tricyclodecanedimethanoldiacrylate.

Other diluents may be used in amounts of preferably less than about 10 wt. %. Examples of these diluents are N-vinyl functional or vinylether functional compounds with a molecular weight lower than about 500. Examples of these diluents are N-vinyl caprolactam, butyl-vinylether, triethyleneglycoldivinylether, butanediol-divinylether and the like.

The diluents preferably are used in a quantity sufficient to adjust the total coating composition to a viscosity of lower than about 2000 mPa.s, preferably lower than about 800 mPa.s at 25° C., measured with a Couette apparatus (cup-and-bob viscometer at a frequency 100 rpm).

The coating composition of the present invention preferably does not comprise substantial amounts of monomers with relatively strong dipole moments such as N-vinylpyrrolidone, phenoxyethylacrylate, polyoxyalkylane-alkylphenolacrylate and the like. The coating composition furthermore, preferably does not comprise, in substantial amounts, those monomers for which dipoles can be easily included, such as aromatic groups containing acrylates such as phenylacrylates. The person skilled in the art can easily determine the amount allowed in the composition by measuring the dissipation factor.

The coating composition is radiation-curable, and can be cured with electron beam irradiation or with light with a wavelength between about 200 mm and about 700 mm. In the latter case, the composition comprises a light sensitive radical generating compound or mixture of compounds which act as photoinitiators.

The photoinitiator, when used in a small but effective amount to promote radiation cure, must provide reasonable cure speed without causing premature gelation of the composition.

Suitable photoinitiators include the following: hydroxycyclohexylphenyl ketone; hydroxymethylphenylpropanone; dimethoxyphenylacetophenone; 2-methyl-[1,4-(methyl thio)phenyl]-2-morpholino-propanone-1; 1-(4-isopropylphenyl)-2-hydroxy-2-methylpropan-1-one; 1-(4-dodecylphenyl)-2-hydroxy-2-methylpropan-1-one; 4-(2-hydroxyethoxy)phenyl- (2-hydroxy-2-propyl)ketone; diethoxyacetophenone; 2,2-di-sec-butoxyacetophenone; diethoxy-phenyl acetophenone; and mixtures of these.

The photoinitiator, if used, preferably comprises from about 1.0 percent to about 10.0 percent by weight of the composition, based upon the total composition. Preferably, the amount of photoinitiator is from about 2.0 percent to about 7.0 percent by weight. The photoinitiator should be selected such that, when used in the designated amount, a cure speed, as measured in a dose versus modulus curve, of less than about 2.0 J/cm$^2$, and preferably less than about 1.0 J/cm$^2$, is obtained.

Figure 1:
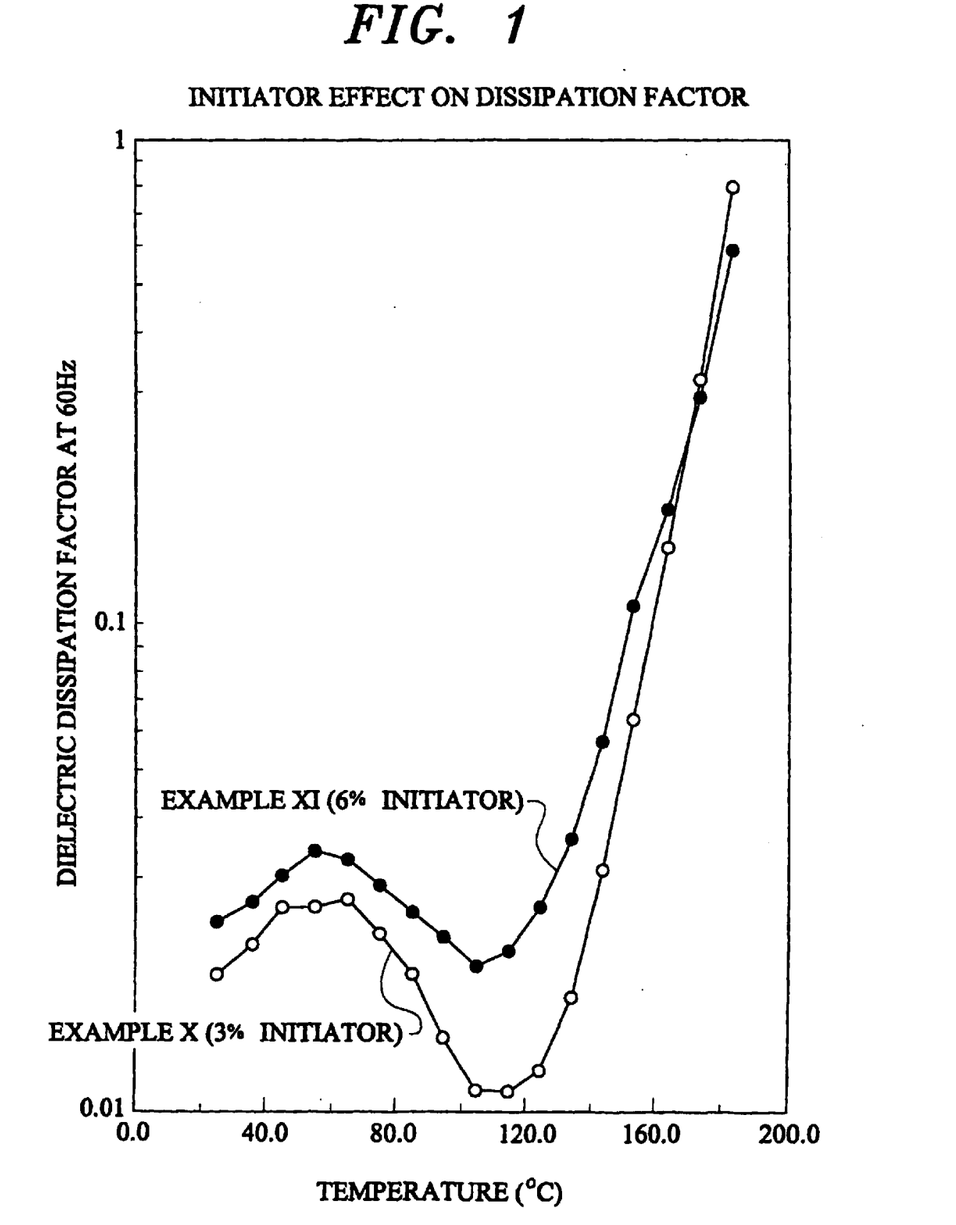
FIG. 1 provides a graphical illustration of temperature dependence of electrical dissipation factor of the radiation-curable coating and the photoinitiator concentration effect on the electrical dissipation factor for Example XI.

FIG. 1 shows the effect on dielectric dissipation factor of cured coatings when varying amounts of photoinitiator are added to pre-cured coating compositions for Example X (3 wt. % photoinitiator) and Example XI (6 wt. % photoinitator).

The composition preferably also contains an adhesion promoter. The adhesion promoter is preferably a compound having a group participating in the radical curing reaction and a group that adheres to the metal conductor. The group that participates in the curing reaction can be preferably, vinyl, (meth)acrylate or thiol. The group that adheres to the metal conductor preferably is hydroxy, acid, zirconate, titanate or silane. The acid may be for example carboxylic, phosphoric or sulphonic. Most preferred is a (meth)acrylate functionalized carboxylic acid or phosphoric acid. Some examples of suitable adhesion promoters include, but are not limited to, hydroxyethyl(meth)acrylate, hydroxypropyl (meth) acrylate, di- or trialkoxy zirconates or titanates, vinyl trimethoxysilane, mercaptopropyltrimethoxy silane, acrylic acid, methacrylic acid, β-carboxyethyl acrylate, EBERCYL 170 and EBERCYL 169. The EBERCYL products are acrylate ester derivatives, available from Radcure Specialties in Atlanta, Ga., and are phosphoric acid based adhesion promoters.

Mono or diester or phosphoric acid having the following formula are also suitable adhesion promoters:

$$[H_2C=\underset{R}{C}-\underset{\|}{\overset{O}{C}}-O-A-O]_{\overline{m}}-\underset{[OH]_p}{\overset{O}{\underset{\|}{P}}}-[OR']_l$$

where
  m+l+p=3
  R=H or CH$_3$
  A=C$_n$H$_{2n}$, and $2 \leq n \leq 6$
  R'=C$_1$ to C$_{14}$ alkyl, aryl, alkaryl, or alkyleneoxy.

Representative of the various species of organophosphate esters having the above formula include, but are not limited to,
(1) methylmethacryloyloxyethyl phosphate, where (R=CH$_3$; A=—C$_2$H$_4$—; R'=CH$_3$, m=1 and p=1);
(2) ethyl methacryloyloxyethyl phosphate, where (R=CH$_3$; A=—C$_2$H$_4$—; R'=C$_2$H$_5$); m=1 and p=1);
(3) propylacryloyloxyethyl phosphate, where (R=H; A=—C$_2$H$_4$—; R'=C$_3$H$_7$; m=1 and p=1);
(4) methyl acryloyloxyethylphosphate, where (R=H, A=—C$_2$H$_4$—; R'=CH$_3$, m=1 and p=1);
(5) ethylacryloyoxyethylphosphate, where (R=H; A=—C$_2$H$_4$—; m=1 and p=1; R'=C$_2$H$_5$);
(6) propylmethacryloyloxy-ethylphosphate, where (R=CH$_3$; A=—C$_2$H$_4$—; R'=C$_3$H$_7$; m=1 and p=1);
(7) bis(methacryloxyethyl)phosphate, where (R=CH$_3$; A=—C$_2$H$_4$—; m=2; l=0; p=1); and
(8) bis(acryloxyethyl)phosphate, where (R=H; A=—C$_2$H$_4$—; m=2; l=0; p=1).

The adhesion promoter helps the coating composition adhere to the metal conductor. The adhesion promoter may be used in an amount in the range of about 0.2 wt. % to about 5 wt. % of the composition. Care should be exercised, that the amount of adhesion promotor is not so large that insulating properties are decreased below acceptable level.

It is an unexpected advantage of the coating composition of the present invention, that an adhesion promoter can be used in effective amounts while maintaining very good insulating properties for the cured coating.

In addition to the above components, the composition may also contain other components that are known to those skilled in the art including stabilizers, surfactants, plasticizers, chain transfer agents and the like.

In addition, it may be useful to use a small amount of pigment or dye to color the cured coating. This allows simple visual control of the coated metal conductor. This is in particular useful, in case the metal conductor is only partly coated. Suitable pigments or dyes are for example copper phthalocyanine blue, crystal violet lactone (blue), crystal malachite green, sheet fed rubine (red). The amount of pigment, if used, will in general be about 0.2 wt. % to about 5 wt. % relative to the coating composition.

Figure 2:
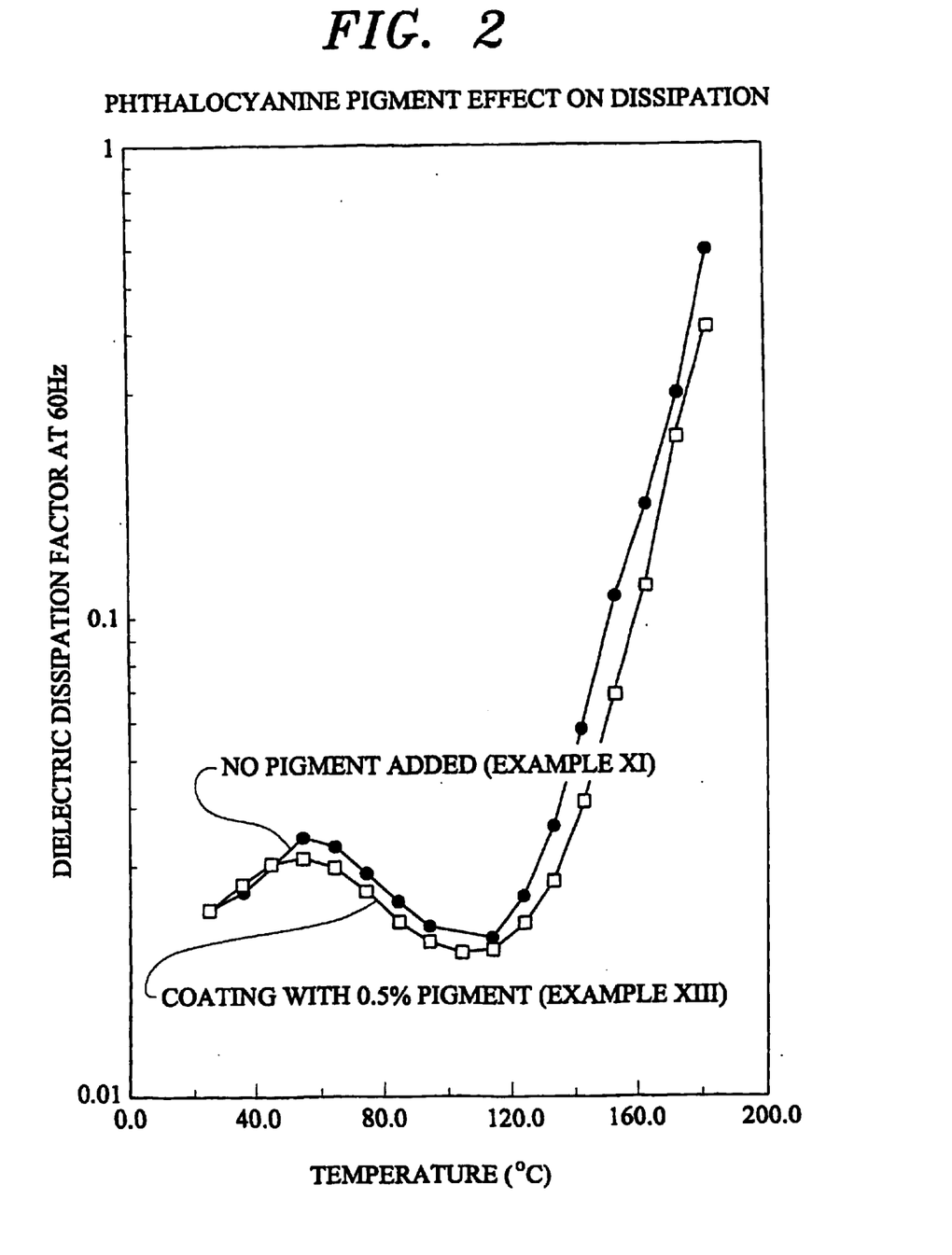
FIG. 2 provides a graphical illustration of the phthalocyanine pigment effect on electrical dissipation factor for Example XII.
Figure 3A:
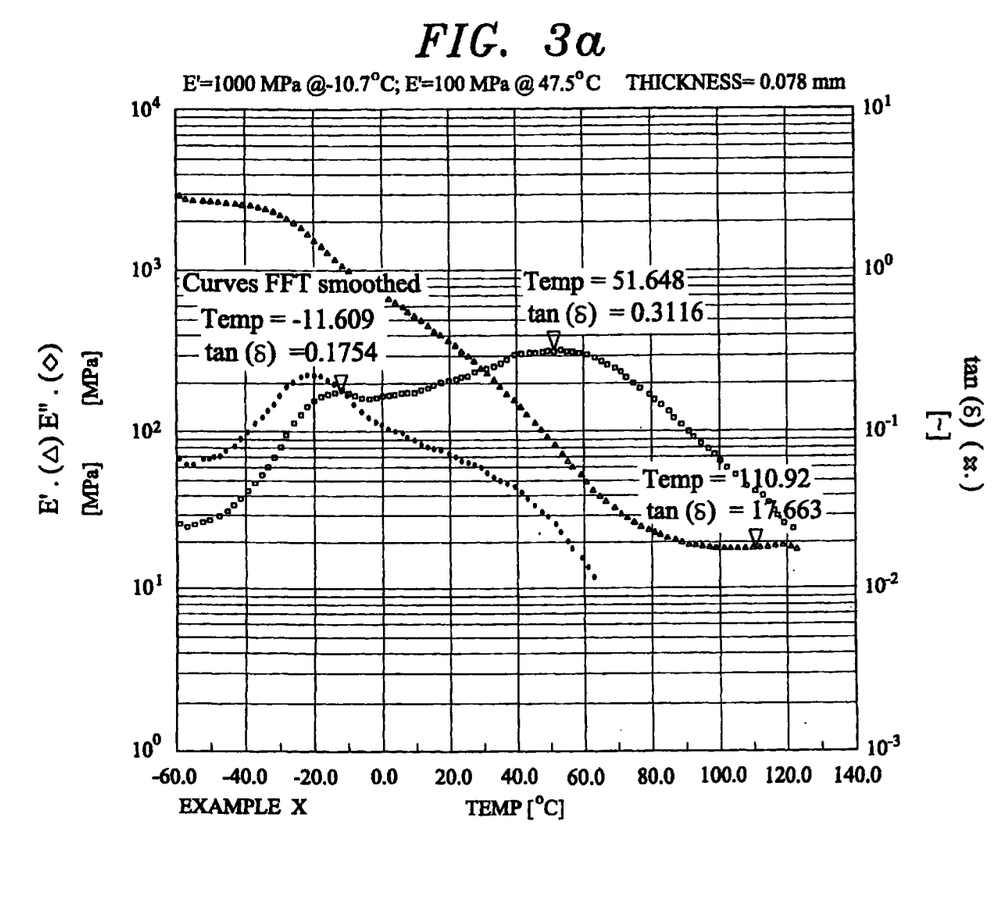
FIGS. 3a and 3b provide the elastic modulus (E'), viscosity modulus (E") and tan delta peak (E"/E') as measured by conventional DMA methods for coating Examples X and XI of the present invention, respectively.
Figure 3B:
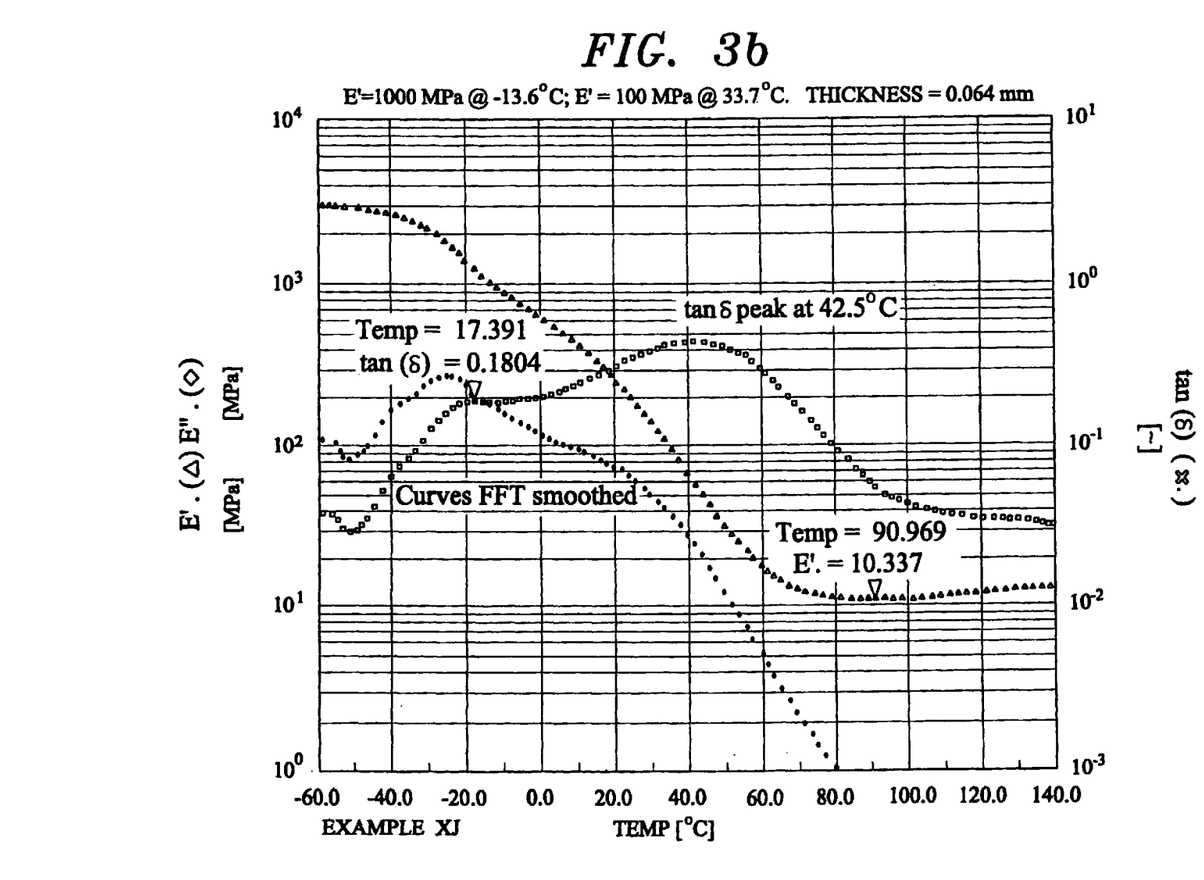
Figure 4A:
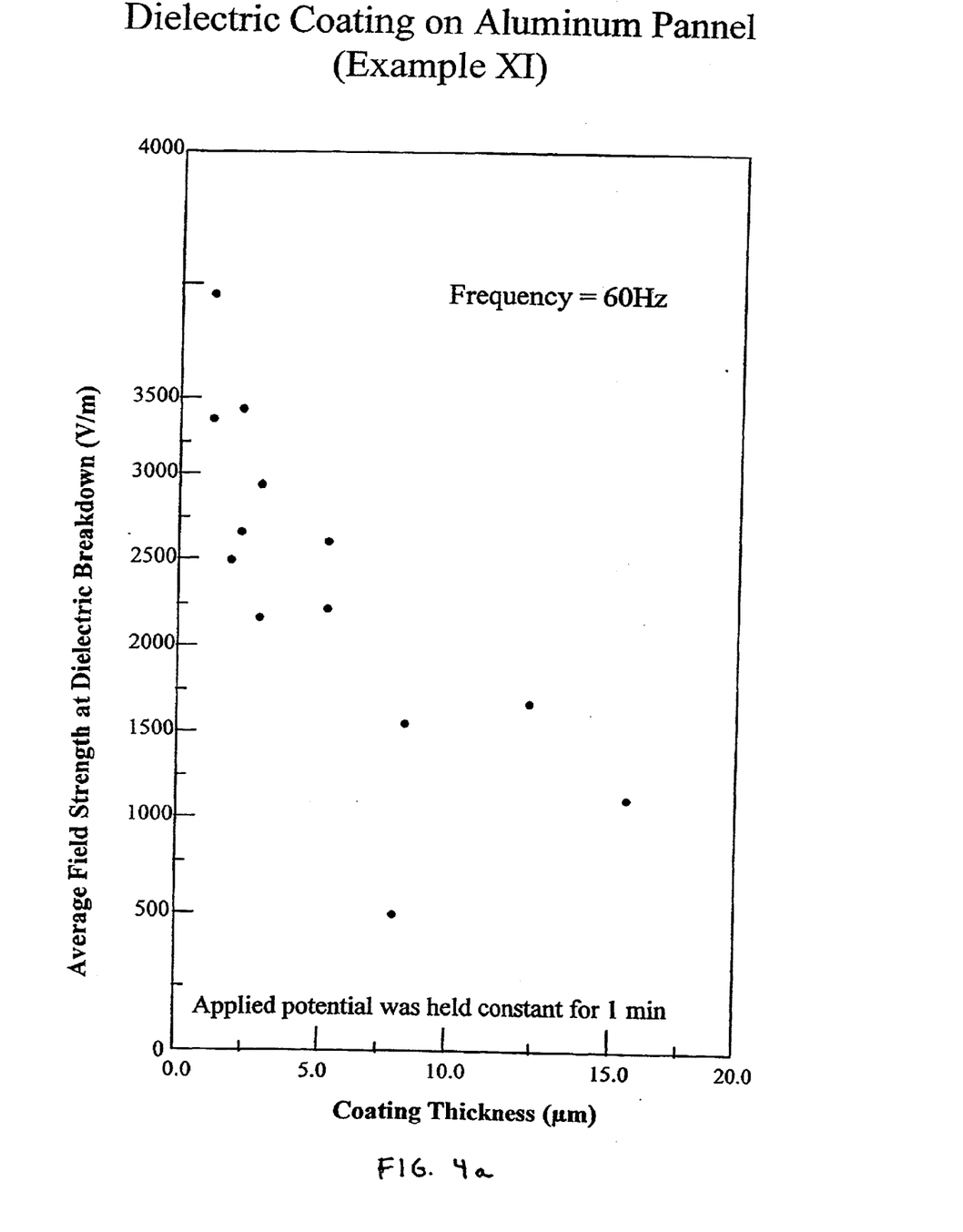
FIGS. 4a and 4b provide the average field strength at Dielectric breakdown for different thicknesses of coating Example XI of the present invention as measured with the applied potential being held constant and the applied potential increasing at the rate of 500V/second, respectively.
Figure 4B:
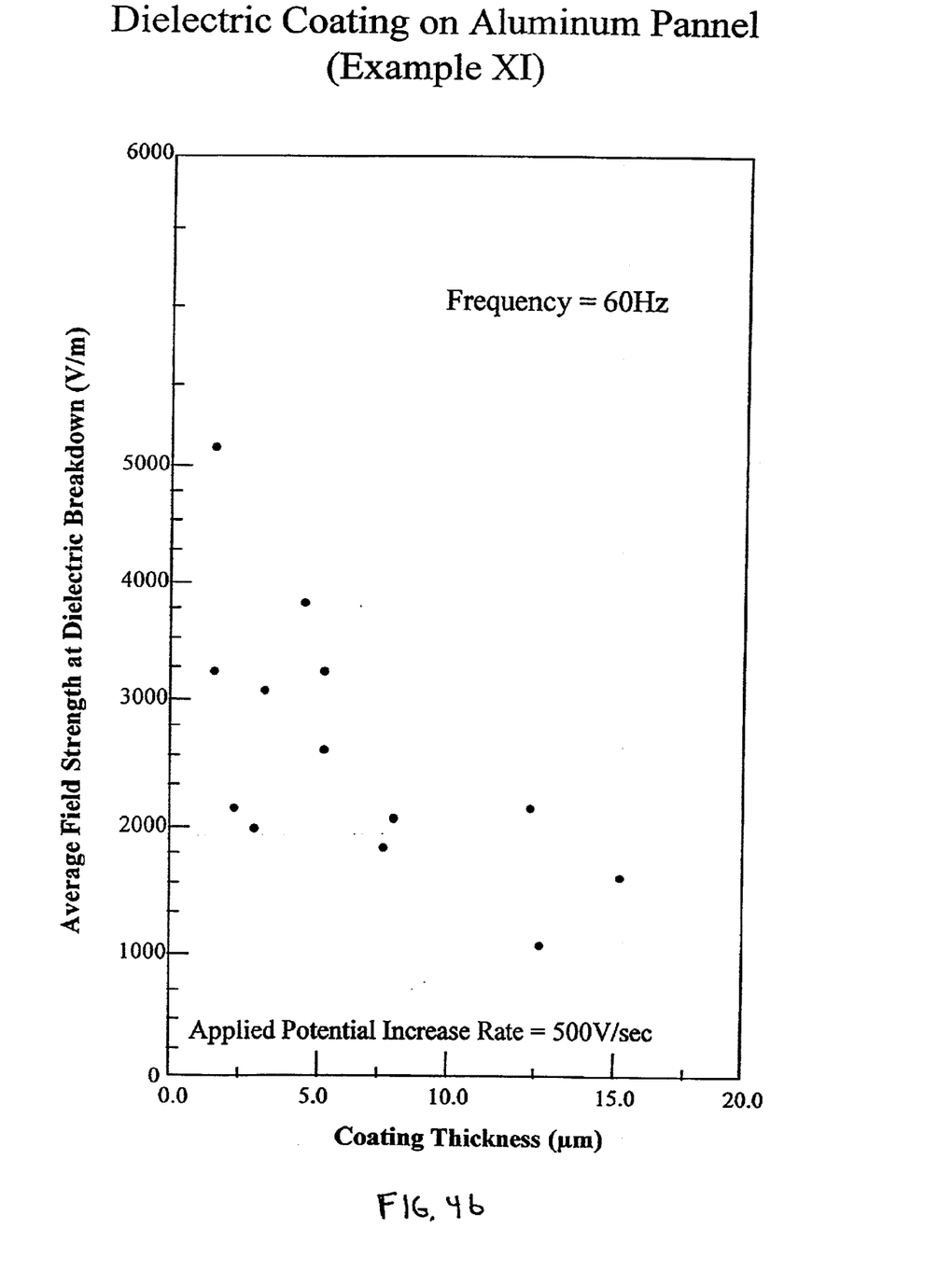

FIG. 2 shows the dielectric dissipation factor for sample coatings, Examples XI and XIII, and the absence of any negative effect resulting from the addition of phthalocyanine pigment (0.5 wt. %) to the pre-cured coating composition.

The coating composition may be applied on the metal conductor using known coating methods, such as spraying, vacuum coating, dipping and doctoring. The coating composition may be applied under a nitrogen atmosphere to preclude oxygen inhibition; however, this is not strictly necessary. If, for example, a relatively large amount of photoinitiator is used in the composition, the cure of the surface of the film is adequate as well.

The invention will be further demonstrated by the following, non limiting examples.

EXAMPLES

Preparation of Acrylate Functional Oligomer A

Isophorone diisocyanate (IPDI 429 g) was dissolved in laurylacrylate (420 g) with 1 g BHT (butylated hydroxy toluene) 0.7 g phenolthiazine and 2 g dibutyltindilaurate. To this mixture, 224 g of hydroxyethylacrylate (HEA) was slowly added, and the temperature was kept below 35° C. To the acrylate-isocyanate adduct, 2318 g of a hydrocarbon diol was added (Nisso PB 2000) and it was allowed to react. About 105 g of laurylacrylate was added and the final NCO content was determined to be below 0.1%. The resulting oligomer A had a theoretical molecular weight of 3089 and was a clear solution of 85% oligomer in 15% laurylacrylate.

Preparation of Acrylate Functional Oligomer B

In an analogous way as the preparation of oligomer A, an oligomer was made from 400 g IPDI, 139 g HEA, 2876 g Nisso PB 2000 and 380 g laurylacrylate. The theoretical molecular weight of the resulting oligomer B is 5733.

Preparation of Acrylate Functional Oligomer C

In an analogous way as the preparation of oligomer A, oligomer C was prepared from 81 g IPDI, 42 g HEA, 430 g of Nisso PB 2000 and 140 g isobornylacrylate. The theoretical molecular weight of the resulting oligomer C is 3093.

Examples I–VII

Coating compositions were prepared with the oligomer in 15% diluent mixtures using oligomers A–C, with further diluents and a photoinitiator as shown in Table 1. The coating compositions were applied on an aluminum plate and cured with 2 J/cm$^2$ light of a fusion D bulb. For measuring the dissipation factor 150 μm thick films were cast on a glass plate and cured with 2 J/cm; the dissipation factor was measured at 24° C. and 150° C. at 60 Hz with standard equipment with stainless steel electrodes. Results are shown in Table 1.

TABLE 1

| Component | I | II | III | IV | V | VI | VII |
|---|---|---|---|---|---|---|---|
| oligomer A | 51.8 | | 57 | | 57 | | |
| oligomer B | | 51.8 | | 57 | | | 57 |
| oligomer C | | | | | | 57 | |
| laurylacrylate | 36.4 | 36.4 | | | | | |
| isobornylacrylate | | | 30 | 30 | 30 | 30 | 30 |
| PHOTOMER 3016[1] | 9.1 | 9.1 | | | | | |
| SA 1002[2] | | | 10 | 10 | | 10 | 10 |
| SR 349[3] | | | | | 10 | | |
| IRGACURE 500[4] | 2.7 | 2.7 | 3 | 3 | 3 | 3 | 3 |
| Dissipation factor 60 Hz | | | | | | | |
| at 24° C. | 0.028 | 0.038 | 0.030 | 0.033 | 0.033 | 0.015 | 0.027 |
| at 150° C. | 0.098 | 0.106 | 0.021 | 0.023 | 0.023 | 0.010 | 0.028 |
| Dielectrical constant | <3.0 | <3.0 | <3.0 | <3.0 | <3.0 | <3.0 | <3.0 |

[1] PHOTOMER 3016 is: Bisphenol-A-diacrylate available from Henkel
[2] SA 1002 is: tricyclododecanedimethanol diacrylate available from Sartomer
[3] SR349 is: ethoxylated bis phenol-A-diacrylate available from Sartomer
[4] IRGACURE 500 is available from Ciba-Geigy Examples VIII–XVIII In an analogous way, further coating compositions were made and tested. The oligomer C was used in these examples.

Compositions and results are summarized in Tables 2 and 3. The coating compositions were spin coated on an aluminum panel, and cured with 1 J/cm, resulting in a 12.5 μm film; furthermore, coatings were cast on a glass plate and cured with 2 J/cm$^2$.

Test Procedures

Elastic modulus (E'), viscous modulus (E"), and tan delta (E"/E') were measured by conventional DMA. A free film specimen of cured material was cut to size (about 35 mm length), measured for width and thickness and mounted. The environmental chamber containing the sample was brought to 80° C. The sample was stretched before temperature sweep was started. The temperature was lowered in prescribed steps to the starting temperature. The temperature sweep was started and allowed to proceed upwards on the temperature scale until the material was beyond the glass transition range and well into the rubbery range. The DMA instrument (Rheometrics Solids Analyzer, RSA-II equipped with a personal computer) produced a plot of the data on the computer screen. The temperature at which E' is 1,000 MPa and E' is 100 MPa was calculated from this plot, as well as the tan delta peak. The minimum value of E' attained in the rubbery region was measured.

Cured coating samples were tested for flexibility and structural integrity under the strain required for a 180° bend of coated 0.0625" thick aluminum substrate over 0.25" mandrel at 25° C. Visual examination of the tested samples indicated the cured samples tested maintained structural integrity and did not delaminate from the aluminum substrate. Results of the 180° bend test are recorded for Examples VIII, IX, X, XI, XII, XIII in Table 2. Results for Examples XIV, XV, XVI, XVII and XVIII are shown in Table 3.

Samples of the coating compositions were tested for blocking by spin coating the pre-cured compositions on aluminum panels to form films. The compositions were cured at 1 J/cm2, under air and testing at 60° C. by placing weights on top of a 10×10 cm area of superimposed films. The samples were then placed in the oven for 3 days. No blocking was detected. The results shown in Tables 2 and 3.

Samples of 25 μm thick cured coating compositions were tested for adhesion to a 1.59 mm thick aluminum panel which was bent 180° over a 6.4 mm diameter mandrel and immersed in 150° C. oil for 28 days. Adhesion of the 25 μm thick cured coating samples was tested using crosshatch method well known in the art and described in detail in "Coating Technology Handbook", by U. Zorll, published by Marcel Dekker, Inc., (1991) and incorporated herein by reference. The results are shown in Tables 2 and 3.

Dissipation factor of the cured coatings was tested my methods well known in the art. Results are recorded in Tables 2 and 3. FIGS. 1 and 2 provide additional dielectric dissipation factor recordings for cured coating composition Examples X, XI and XIII.

The temperature sensitivity of dissipation factors (%) for Examples IX, X, XI and XIII for temperatures ranging from 25° C. through 185° C. are shown in Table 4.

TABLE 2

| Component | VIII | IX | X | XI | XII | XIII |
|---|---|---|---|---|---|---|
| Oligomer C | 50 | 50 | 55.6 | 54.03 | 48.45 | 53.8 |
| Isobornylacrylate | | | 11.1 | 10.8 | | 10.8 |
| tricyclodecanedimethanol diacrylate | 24.0 | 24.0 | | | 23.26 | |
| 2-ethylhexylacrylate | | 20.0 | | | | |
| hexanedioldiacrylate | | | 26.7 | 25.93 | | 25.8 |
| cyclohexylacrylate | 20.0 | | | | | |
| isooctylacrylate | | | | | 19.38 | |
| DAROCURE 1173 (Ciba-Geigy) | 3.0 | 3.0 | 3.3 | 6.0 | 6.0 | 5.9 |
| EBECRYL 170 (Radcure) | 3.0 | 3.0 | 3.3 | 3.24 | 2.91 | 3.2 |
| phthalocyanine blue | | | | | | 0.5 |

TABLE 2-continued

| Component | VIII | IX | X | XI | XII | XIII |
|---|---|---|---|---|---|---|
| Viscosity (mPa.s) at 25° C. | 700 | 500 | 785 | 730 | 450 | 730 |
| Dissipation Factor at 25° C., 60 Hz | 0.02 | 0.029 | 0.019 | 0.024 | ~0.02 | 0.025 |
| Dissipation Factor at 150° C., 60 Hz | 0.083 | 0.032 | 0.060 | 0.082 | ~0.05 | 0.053 |
| stability under 150° C. oil immersion | pass | pass | slight defect | pass | pass | pass |
| Blocking of coating at 60° C. | nd | nd | nd | pass | pass | pass |
| Dielectric constant at 24° C., 60 Hz | <2.7 | <2.7 | <2.7 | <2.7 | <2.7 | <2.7 |
| Tg (° C.) | | −17 | −11 | | | |
| 180° bend test | pass | pass | pass | pass | pass | pass |

TABLE 3

| Component | XIV | XV | XVI | XVII | XVIII |
|---|---|---|---|---|---|
| Oligomer C | 50 | 60 | 50 | 50 | 50 |
| Isobornylacrylate | 14 | 14 | 20 | 24 | |
| tricyclodecanedimethanol diacrylate | 30 | | 24 | 20 | 20 |
| hexanedioldiaacrylate | | 20 | | | 24 |
| DAROCURE 1173 (Ciba-Geigy) | 3.0 | 3.0 | 3.3 | 3.0 | 3.0 |
| EBECRYL 170 (Radcure) | 3.0 | 3.0 | 3.3 | 3.0 | 3.0 |
| Viscosity (mPa.s) | 1910 | 785 | 700 | 1240 | 1090 |
| Dissipation factor at 25° C., 60 Hz | 0.020 | 0.029 | 0.019 | 0.024 | ~0.02 |
| Dissipation factor at 150° C., 60 Hz | 0.083 | 0.032 | 0.060 | 0.082 | ~0.08 |
| stability under 150° C. oil immersion | pass | pass | slight defect | pass | pass |
| 180° bend test | pass | pass | pass | pass | pass |

TABLE 4

| Temperature (° C.) | IX | X | XI | XIII |
|---|---|---|---|---|
| 25 | 0.029 | 0.019 | 0.0244 | 0.0246 |
| 36 | 0.031 | 0.022 | 0.0269 | 0.0277 |
| 45 | 0.033 | 0.026 | 0.0304 | 0.0305 |
| 55 | | 0.026 | 0.0341 | 0.0311 |
| 65 | 0.024 | 0.027 | 0.0328 | 0.0297 |
| 75 | 0.017 | 0.023 | 0.029 | 0.0266 |
| 85 | 0.011 | 0.019 | 0.0254 | 0.0229 |
| 95 | 0.0065 | 0.014 | 0.0225 | 0.0208 |
| 105 | 0.006 | 0.011 | 0.0198 | 0.0197 |
| 115 | 0.007 | 0.011 | 0.0211 | 0.02 |
| 125 | 0.01 | 0.012 | 0.0258 | 0.0226 |
| 135 | 0.014 | 0.017 | 0.0358 | 0.0276 |
| 145 | 0.024 | 0.031 | 0.0566 | 0.0399 |
| 155 | 0.041 | 0.063 | 0.107 | 0.0663 |
| 165 | 0.07 | 0.14 | 0.168 | 0.114 |
| 175 | 0.126 | 0.31 | 0.29 | 0.233 |
| 185 | 0.27 | 0.78 | 0.579 | 0.401 |

While the invention has been described in detail and with reference to specific embodiments thereof, it will be apparent to those of ordinary skill in the art that various changes and modifications can be made therein without departing from the spirit and scope thereof.

What is claimed is:

1. A radiation curable composition comprising:
   (a) an acrylate functional urethane oligomer having a hydrocarbon backbone;
   (b) 5–50 wt %, relative to the total weight of the composition, of one or more polyfunctional diluents selected from the group consisting of polyacrylated alkyl monomers, bisphenol A diacrylate, and ethoxylated bisphenol A diacrylate;
   (c) a (meth)acrylate ester of phosphoric acid;
   (d) 1.0 to 10 wt %, relative to the total weight of the composition, of a photoinitiator; and
   (e) 5–50wt %, relative to the total weight of the composition, of one or more monofunctional diluents selected from the group consisting of alkyl (meth) acrylate monomers, N-vinyl functional diluents, and vinyl ether functional diluents;
   wherein said composition, after cure, has a dielectric dissipation factor at 60 Hz and 150° C. of lower than about 0.2; and at least one Tg of below 20° C.

2. A radiation-curable composition according to claim 1, wherein said hydrocarbon backbone is fully saturated.

3. The composition of claim 1 wherein said composition, after cure, has a dielectric dissipation factor at 60 Hz and 24° C. of lower than about 0.05.

4. The composition of claim 1, wherein said composition after cure has an elongation at 25° C. of at least about 50%.

5. The composition of claim 1, wherein the urethane oligomer is the reaction product of a hydrocarbon polyol, a polyisocyanate and an hydroxyfunctional endcapping monomer.

6. The composition of claim 5, wherein the polyisocyanate is an aliphatic polyisocyanate.

7. The composition of claim 1, further comprising from about 0.2% by weight to about 5% by weight, relative to the total composition, of a pigment or dye.

8. The composition of claim 1, wherein said one or more monofunctional diluents includes an acrylate functional diluent.

9. The composition of claim 1, wherein said (meth) acrylate ester is present in an amount of from about 0.2% by weight to about 5% by weight, relative to the total composition.

10. The composition of claim 1, wherein
   (i) the urethane oligomer is present in an amount of from about 20% by weight to about 80% by weight, relative to the total composition, and
   (ii) the one or more monofunctional diluents and the one or more polyfunctional diluents are, combined, present in an amount of from about 20% by weight to about 80% by weight, relative to the total composition.

11. The composition of claim 10, wherein said (meth) acrylate ester is present in an amount of from about 0.2% by weight to about 5% by weight, relative to the total composition.

12. The composition of claim 1, wherein said (meth) acrylate ester is present in an amount of from about 0.2% by weight to about 4% by weight, relative to the total composition.

13. The composition of claim 1, wherein the urethane oligomer is present in an amount of from about 30% by weight to about 65% by weight, said one or more monoacrylate functional diluents is present in an amount of from about 10% by weight to about 50 % by weight, and said one or more polyfunctional diluents is present in an amount of from about 5% by weight to about 40% by weight, all relative to the total weight of the composition.

14. The composition of claim 13, wherein said (meth) acrylate ester is present in an amount of from about 0.2% by weight to about 4% by weight, relative to the total composition.

15. The composition of claim 14, wherein said photoinitiator is present in an amount of from about 2% by weight to about 7% by weight, relative to the total composition.

16. The composition of claim 1, wherein the hydrocarbon backbone has a molecular weight of from about 200 to about 5,000.

17. The composition of claim 1, wherein the hydrocarbon backbone has a molecular weight of from about 400 to about 4,000.

18. The composition of claim 1, wherein said composition, after cure, is able to withstand immersion in oil for 28 days at 150° C.

19. The composition of claim 1, comprising, relative to the total weight of the composition, less than 10 wt % of N-vinyl functional or vinyl ether functional compounds having a molecular weight below about 500.

* * * * *